(12) United States Patent
Yang et al.

(10) Patent No.: US 11,764,120 B2
(45) Date of Patent: Sep. 19, 2023

(54) CHIP PACKAGING STRUCTURE AND MANUFACTURING METHOD THEREOF

(71) Applicant: Unimicron Technology Corp., Taoyuan (TW)

(72) Inventors: Kai-Ming Yang, Hsinchu County (TW); Chia-Yu Peng, Taoyuan (TW); Pei-Chi Chen, Taoyuan (TW); Pu-Ju Lin, Hsinchu (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 223 days.

(21) Appl. No.: 17/155,094

(22) Filed: Jan. 22, 2021

(65) Prior Publication Data

US 2022/0208630 A1    Jun. 30, 2022

(30) Foreign Application Priority Data

Dec. 28, 2020   (TW) .................................. 109146420

(51) Int. Cl.
| | |
|---|---|
| *H01L 23/31* | (2006.01) |
| *H01L 23/498* | (2006.01) |
| *H01L 21/56* | (2006.01) |
| *H01L 21/78* | (2006.01) |

(52) U.S. Cl.
CPC ........ *H01L 23/3128* (2013.01); *H01L 21/561* (2013.01); *H01L 21/568* (2013.01); *H01L 21/78* (2013.01); *H01L 23/49816* (2013.01); *H01L 23/49827* (2013.01)

(58) Field of Classification Search
None
See application file for complete search history.

(56) References Cited

U.S. PATENT DOCUMENTS

| | | |
|---|---|---|
| 8,835,230 B2 | 9/2014 | Scanlan |
| 8,987,057 B2 | 3/2015 | Van Gemert et al. |
| 10,062,652 B2 | 8/2018 | Lee et al. |
| 10,177,111 B2 | 1/2019 | Kamphuis et al. |
| 2004/0113283 A1* | 6/2004 | Farnworth ............ H01L 23/481 |
| | | 257/E29.022 |
| 2013/0037935 A1* | 2/2013 | Xue .................... H01L 23/3114 |
| | | 257/737 |
| 2016/0233187 A1* | 8/2016 | Kim .................... H01L 23/3114 |
| 2017/0162519 A1 | 6/2017 | Ko et al. |

FOREIGN PATENT DOCUMENTS

TW         I636529         9/2018

\* cited by examiner

Primary Examiner — Jay C Chang
(74) *Attorney, Agent, or Firm* — JCIPRNET (57) ABSTRACT

A chip packaging structure includes a chip, a redistribution layer, a solder ball, an encapsulant, and a stress buffer layer. The chip has an active surface and a back surface opposite to each other, and a peripheral surface connected to the active surface and the back surface. The redistribution layer is disposed on the active surface of the chip. The solder ball is disposed on the redistribution layer, and the chip is electrically connected to the solder ball through the redistribution layer. The encapsulant encapsulates the active surface and the back surface of the chip, the redistribution layer, and part of the solder ball. The stress buffer layer at least covers the peripheral surface of the chip. An outer surface of the stress buffer layer is aligned with a side surface of the encapsulant.

4 Claims, 6 Drawing Sheets

CHIP PACKAGING STRUCTURE AND MANUFACTURING METHOD THEREOF

CROSS-REFERENCE TO RELATED APPLICATION

This application claims the priority benefit of Taiwan application serial no. 109146420, filed on Dec. 28, 2020. The entirety of the above-mentioned patent application is hereby incorporated by reference herein and made a part of this specification.

BACKGROUND

Technical Field

The disclosure relates to a packaging structure and a manufacturing method thereof, and more particularly to a chip packaging structure and a manufacturing method thereof.

Description of Related Art

In the prior art, elastic materials, packaging materials, or a hanging structure under the bare die can serve as anchors to protect the edges of a chip or enhance the mechanical strength of an encapsulant. At present, in one product, the elastic materials or the packaging materials simply protect the back and the spherical surface of the chip but fail to effectively protect the edges of the chip. Alternatively, in another product, the packaging materials are adapted to protect the edges of the chip. Although the chip can be prevented from cracking and causing chip failure in the reliability experiment, the difference in thermal expansion coefficient between the encapsulant and the chip leads to reduction of the number of the reliability and the lifespan of the product.

SUMMARY

The disclosure provides a chip packaging structure capable of effectively protecting the edges of a chip and increasing the overall structural strength and the structural reliability.

The disclosure provides a manufacturing method of a chip packaging structure for manufacturing the chip packaging structure.

The chip packaging structure in the disclosure includes a chip, a redistribution layer, a solder ball, an encapsulant, and a stress buffer layer. The chip has an active surface and a back surface opposite to each other, and a peripheral surface connected to the active surface and the back surface. The redistribution layer is disposed on the active surface of the chip. The solder ball is disposed on the redistribution layer, and the chip is electrically connected to the solder balls through the redistribution layer. The encapsulant encapsulates the active surface and the back surface of the chip, the redistribution layer, and part of the solder ball. The stress buffer layer at least covers the peripheral surface of the chip. An outer surface of the stress buffer layer is aligned with one side surface of the encapsulant.

In an embodiment of the disclosure, the redistribution layer includes a circuit layer and at least one conductive via. The conductive via is located between the circuit layer and the active surface of the chip. The chip is electrically connected to the circuit layer through the conductive via.

In an embodiment of the disclosure, the chip packaging structure further includes a surface treatment layer disposed on the redistribution layer and between the solder ball and the redistribution layer.

In an embodiment of the disclosure, the encapsulant has an upper surface and a lower surface opposite to each other. The side surface is connected to the upper surface and the lower surface, and the side surface includes a first side surface and a second side surface. The stress buffer layer is further extended to cover the first side surface and the upper surface, and the outer surface of the stress buffer layer is aligned with the second side surface.

In an embodiment of the disclosure, a first vertical distance exists between the upper surface of the encapsulant and the active surface of the chip. A second vertical distance exists between the lower surface of the encapsulant and the back surface of the chip. The first vertical distance is greater than the second vertical distance.

In an embodiment of the disclosure, a height of the stress buffer layer is equal to or slightly greater than a thickness of the chip.

In an embodiment of the disclosure, a material of the stress buffer layer is different from a material of the encapsulant, the material of the stress buffer layer includes silane adhesion promoters, silicone rubber, epoxy resin, or photosensitive dielectric materials (e.g., PI, PBO, BCB, or PID).

The manufacturing method of the chip packaging structure in the disclosure includes the following steps. A semi-finished package is provided. The semi-finished package includes a wafer, a redistribution layer, a plurality of solder balls, and an encapsulant. The redistribution layer is located between the solder balls and the wafer. The encapsulant encapsulates the wafer, the redistribution layer, and part of the solder balls. A plurality of grooves are formed in the encapsulant. The grooves are disposed in a staggered manner, are extended from an upper surface of the encapsulant, and pass through the wafer, so that the wafer is divided into a plurality of chips. Each of the chips comprises an active surface and a back surface opposite to each other, and a peripheral surface connected to the active surface and the back surface. The redistribution layer is disposed on the active surface of the chip. Each of the chips is electrically connected to each corresponding solder ball through the redistribution layer. The encapsulant encapsulates the active surface and the back surface of each of the chips, the redistribution layer, and the corresponding part of the solder balls. A stress buffer layer is formed on the upper surface of the encapsulant and extended and disposed in the grooves. The stress buffer layer exposes the part of the solder balls. A singulation process is performed to cut the stress buffer layer and the encapsulant to form a plurality of chip packaging structures separated from one another. The encapsulant has the upper surface and a lower surface opposite to each other, and a side surface connected to the upper surface and the lower surface. The side surface includes a first side surface and a second side surface. The stress buffer layer covers the first side surface and the upper surface, and an outer surface of the stress buffer layer is aligned with the second side surface.

In an embodiment of the disclosure, the manufacturing method of the chip packaging structure further includes providing a carrier board on which the semi-finished package is disposed before providing the semi-finished package and removing the carrier board to expose the lower surface of the encapsulant before performing the singulation process.

In an embodiment of the disclosure, the redistribution layer includes a circuit layer and at least one conductive via. The conductive via is located between the circuit layer and the active surface of the chip. The chip is electrically connected to the circuit layer through the conductive via.

In an embodiment of the disclosure, the semi-finished package further includes a surface treatment layer disposed on the redistribution layer and located between the solder balls and the redistribution layer.

In an embodiment of the disclosure, the step of forming the stress buffer layer includes forming a stress buffer material layer on the upper surface of the encapsulant and extending and disposing the stress buffer material layer in the grooves, wherein the stress buffer material layer covers the solder balls and performing a plasma etching process to remove part of the stress buffer material layer, expose part of the solder balls, and form the stress buffer layer.

In an embodiment of the disclosure, a first vertical distance exists between the upper surface of the encapsulant and the active surface of the chip, a second vertical distance exists between the lower surface of the encapsulant and the back surface of the chip, and the first vertical distance is greater than the second vertical distance.

In an embodiment of the disclosure, a material of the stress buffer layer is different from a material of the encapsulant, and the material of the stress buffer layer includes silane adhesion promoters, silicone rubber, epoxy resin, or photosensitive dielectric materials (e.g., PI, PBO, BCB, or PID).

The manufacturing method of the chip packaging structure of the disclosure includes the following steps. A semi-finished package is provided. The semi-finished package includes a plurality of chips, a redistribution layer, a plurality of solder balls, an encapsulant, and a stress buffer layer. The chips are separated from one another, and each of the chips has an active surface and a back surface opposite to each other, and a peripheral surface connected to the active surface and the back surface. The redistribution layer is disposed on the active surface of the chip. Each of the chips is electrically connected to each corresponding solder ball through the redistribution layer. The encapsulant encapsulates the active surface and the back surface of each of the chips, the redistribution layer, the corresponding part of the solder balls, and the stress buffer layer. The stress buffer layer covers the peripheral surface of each of the chips, and a height of the stress buffer layer is equal to or slightly greater than a thickness of each of the chips. A singulation process is performed to cut the stress buffer layer and the encapsulant to form a plurality of chip packaging structures separated from one another. One side surface of the encapsulant is aligned with an outer surface of the stress buffer layer.

In an embodiment of the disclosure, the manufacturing method of the chip packaging structure further includes providing a carrier board on which the semi-finished package is disposed before providing the semi-finished package and removing the carrier board to expose a lower surface of the encapsulant before performing the singulation process.

In an embodiment of the disclosure, the redistribution layer includes a circuit layer and at least one conductive via. The conductive via is located between the circuit layer and the active surface of the chip, and the chip is electrically connected to the circuit layer through the conductive via.

In an embodiment of the disclosure, the semi-finished package further includes a surface treatment layer disposed on the redistribution layer and located between the solder balls and the redistribution layer.

In an embodiment of the disclosure, the encapsulant has an upper surface and a lower surface opposite to each other, and the side surface connected to the upper surface and the lower surface. A first vertical distance exists between the upper surface of the encapsulant and the active surface of the chip, a second vertical distance exists between the lower surface of the encapsulant and the back surface of the chip, and the first vertical distance is greater than the second vertical distance.

In an embodiment of the disclosure, a material of the stress buffer layer is different from a material of the encapsulant, and the material of the stress buffer layer includes silane adhesion promoters, silicone rubber, epoxy resin, or photosensitive dielectric materials (e.g., PI, PBO, BCB, or PID).

Based on the above, in the chip packaging structure in the disclosure, the encapsulant encapsulates the active surface and the back surface of the chip, the redistribution layer, and part of the solder ball, and the stress buffer layer at least covers the peripheral surface of the chip. That is, the active surface and the back surface of the chip are protected by the encapsulant, and the peripheral surface of the chip is protected by the stress buffer layer. That is, with the disposition of the stress buffer layer, the edges of the chip are effectively protected, and with the disposition of the encapsulant, the structural strength of the chip packaging structure is increased, and therefore the chip packaging structure in the disclosure has favorable structural reliability.

In order to make the features and advantages of the disclosure comprehensible, embodiments accompanied with drawings are described in detail below.

DESCRIPTION OF THE EMBODIMENTS

Figure 1A:
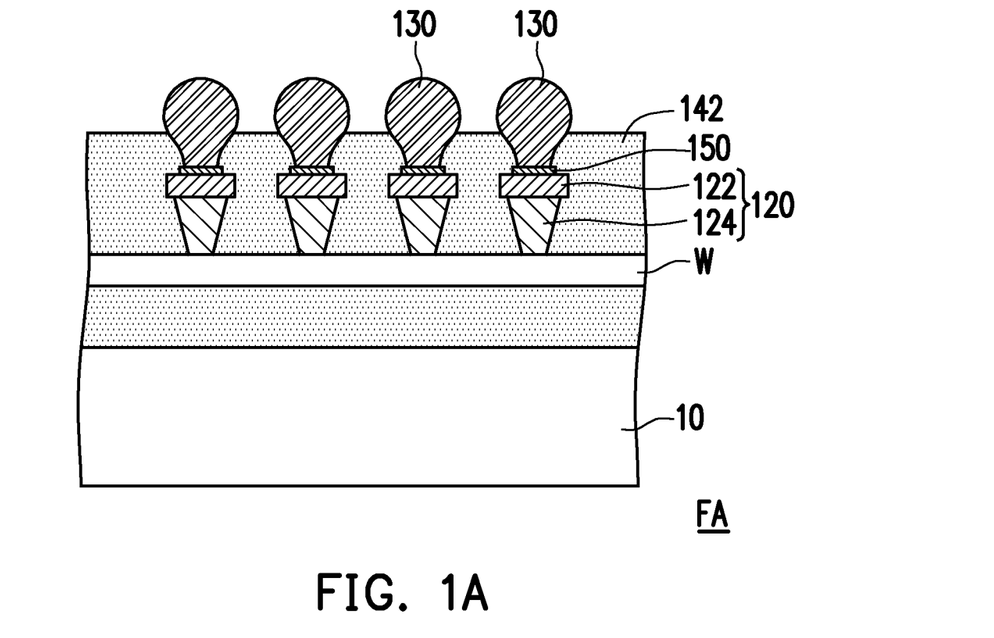
FIG. 1A to FIG. 1F are schematic cross-sectional views of a manufacturing method of a chip packaging structure according to an embodiment of the disclosure.

FIG. 1A to FIG. 1F are schematic cross-sectional views of a manufacturing method of a chip packaging structure according to an embodiment of the disclosure. FIG. 1G is a schematic cross-sectional view of a chip packaging structure according to an embodiment of the disclosure.

Regarding the manufacturing method of the chip packaging structure in the embodiment, a carrier board 10 and a semi-finished package FA are provided first, and the semi-finished package FA is disposed on the carrier board 10. In detail, the semi-finished package FA includes a wafer W, a redistribution layer 120, a plurality of solder balls 130, and an encapsulant 142. The redistribution layer 120 is located between the solder balls 130 and the wafer W; and the encapsulant 142 encapsulates the wafer W, the redistribution layer 120, and part of the solder balls 130. That is, the encapsulant 142 exposes part of the solder balls 130 to serve as a contact point to be electrically connected to the outside.

Furthermore, the redistribution layer 120 in the embodiment includes a circuit layer 122 and at least one conductive via (a plurality of conductive vias 124 are schematically shown), the conductive via 124 is located between the circuit layer 122 and the wafer W, and the circuit layer 122 is an implementation of a patterned circuit layer. Furthermore, the semi-finished package FA in the embodiment further includes a surface treatment layer 150 disposed on the redistribution layer 120 and between the solder balls 130 and the redistribution layer 120. Meanwhile, the surface treatment layer 150, for example, is an electroless nickel electroless palladium immersion gold (ENEPIG) layer, an organic solderability preservatives (OSP) layer, or an electroless nickel immersion gold (ENIG) layer, but the disclosure is not limited thereto. That is, the semi-finished package FA in the embodiment is essentially a wafer level package, and the wiring and ball planting procedures have been completed.

Figure 1B:
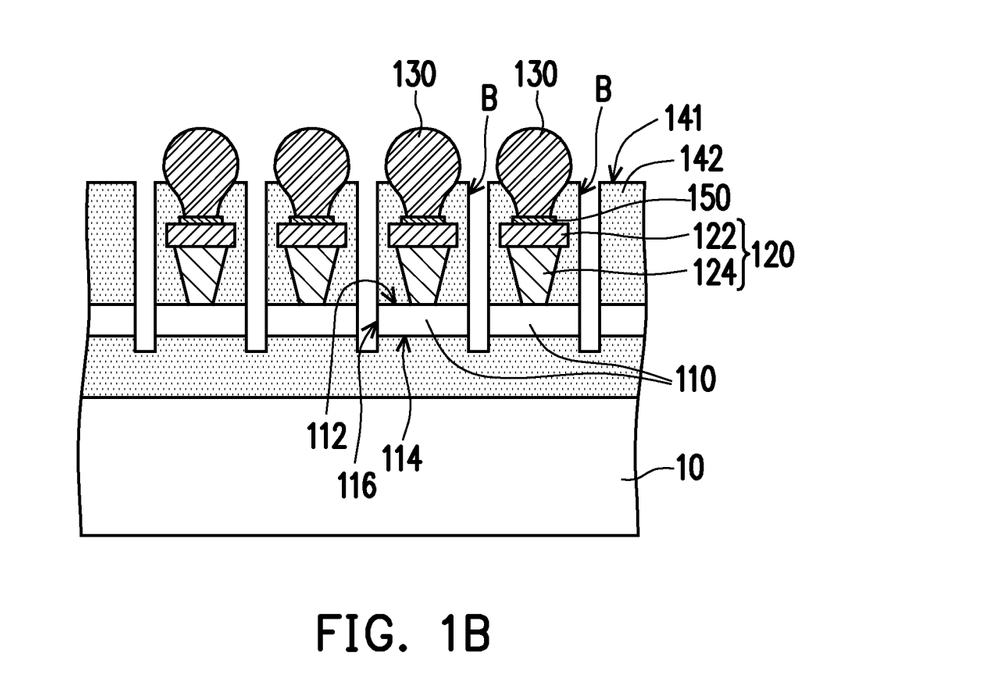

Next, referring to both FIG. 1A and FIG. 1B, a plurality of grooves B are formed in the encapsulant 142, and the grooves B extend from an upper surface 141 of the encapsulant 142 and pass through the wafer W so that the wafer W is divided into a plurality of chips 110. That is, the wafer W is cut to form chips 110 separated from each other. Note that if overviewing the grooves B, they are disposed in a staggered manner.

Meanwhile, each of the plurality of the chips 110 has an active surface 112 and a back surface 114 opposite to each other, and a peripheral surface 116 connected to the active surface 112 and the back surface 114. The redistribution layer 120 is disposed on the active surface 112 of the chip 110, and each of the plurality of chips 110 is electrically connected to the corresponding solder ball 130 through the redistribution layer 120. The encapsulant 142 encapsulates the active surface 112 and the back surface 114 of each of the plurality of the chips 110, the redistribution layer 120, and part of the corresponding solder balls 130.

Figure 1C:
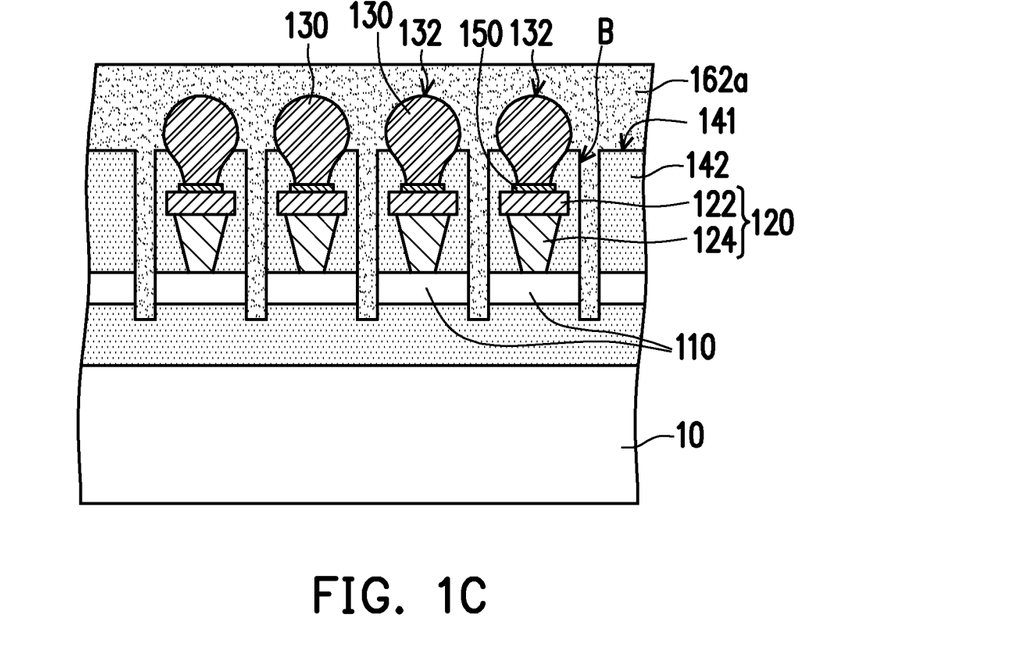

Next, referring to FIG. 1C, a stress buffer material layer 162a is formed on the upper surface 141 of the encapsulant 142, extended to be disposed in the groove B, and fills the groove B. Meanwhile, the stress buffer material layer 162a covers a top surface 132 of the solder ball 130 and has a spacing apart from the top surface 132 of the solder ball 130.

Figure 1D:
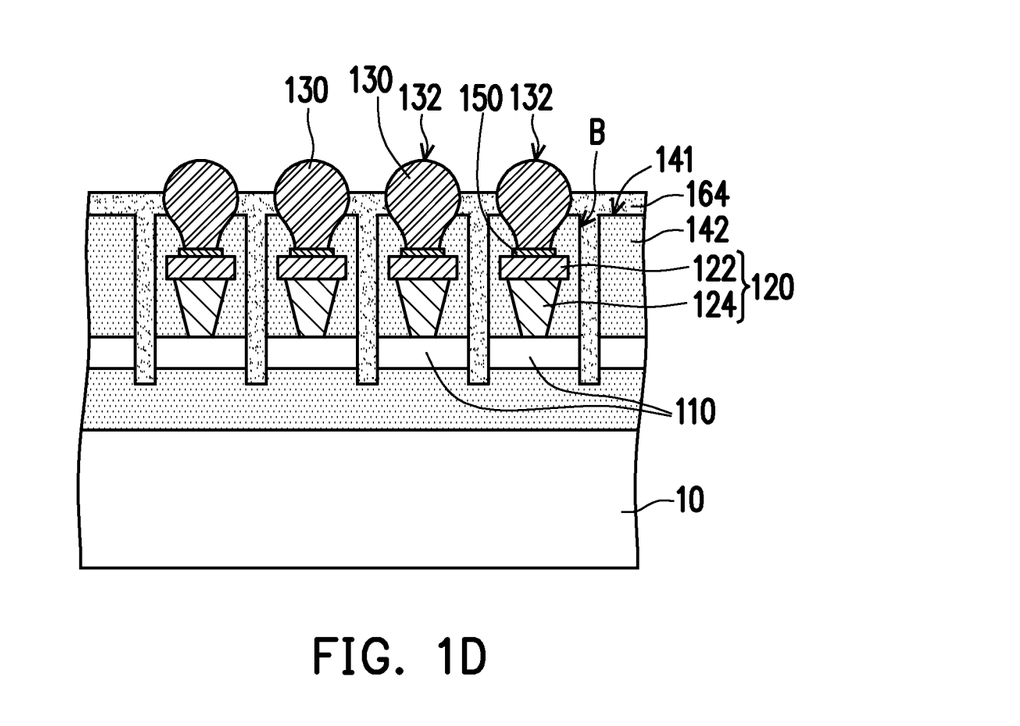

Next, referring to FIG. 1D, a plasma etching process is performed to remove part of the stress buffer material layer 162a, and the top surface 132 of the solder ball 130 is exposed to form a stress buffer layer 164. In particular, in the embodiment, the material of the stress buffer layer 164 is different from the material of the encapsulant 142, and the material of the stress buffer layer 164, for example, is silane adhesion promoters, silicone rubber, epoxy resin, or photosensitive dielectric materials (e.g., PI, PBO, BCB, or PID), but the disclosure is not limited thereto. At the phase, the stress buffer layer 164 has been formed on the upper surface 141 of the encapsulant 142 and extended to be disposed in the groove B and part of the solder balls 130 are exposed.

Figure 1E:
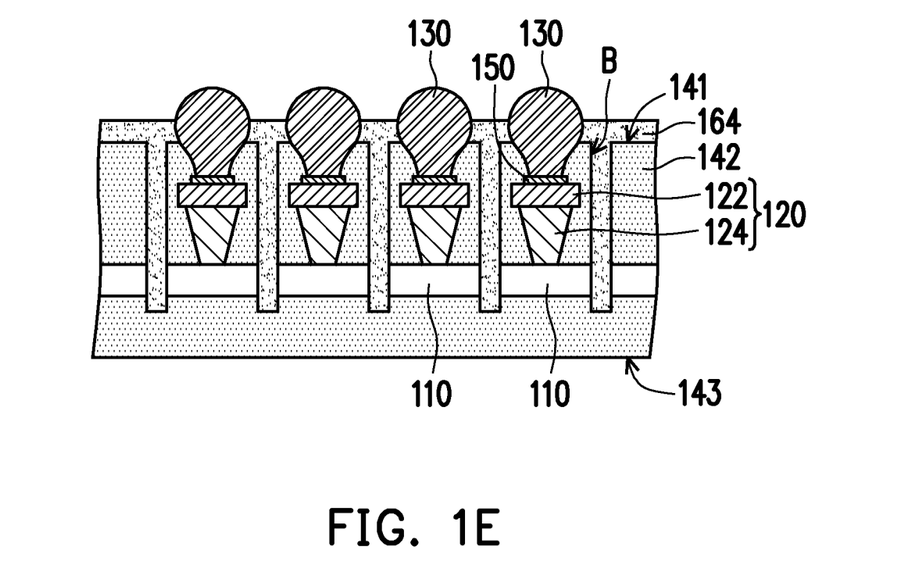

After that, referring to both FIG. 1D and FIG. 1E, the carrier board 10 is removed, and a lower surface 143 of the encapsulant 142 is exposed.

Figure 1F:
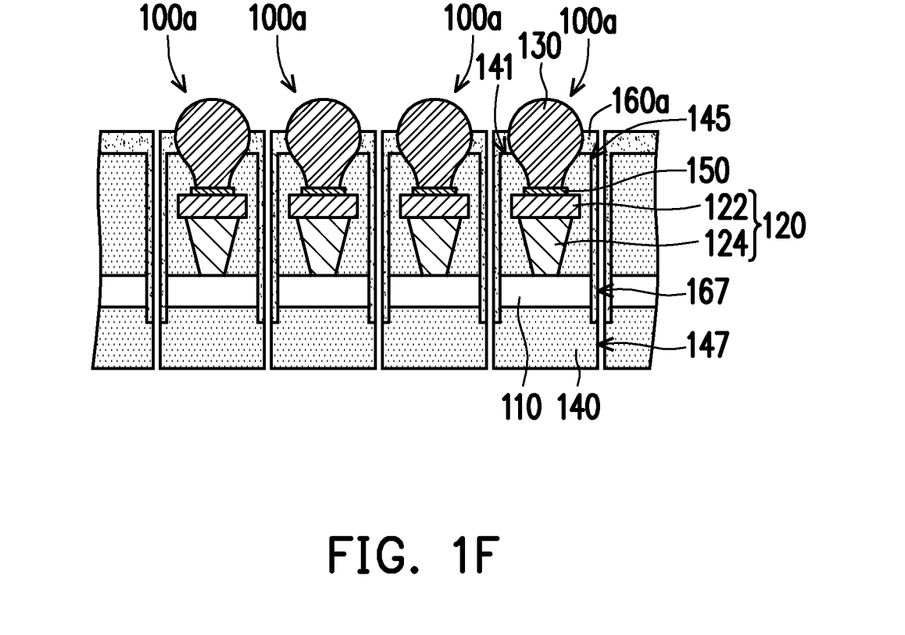
Figure 1G:
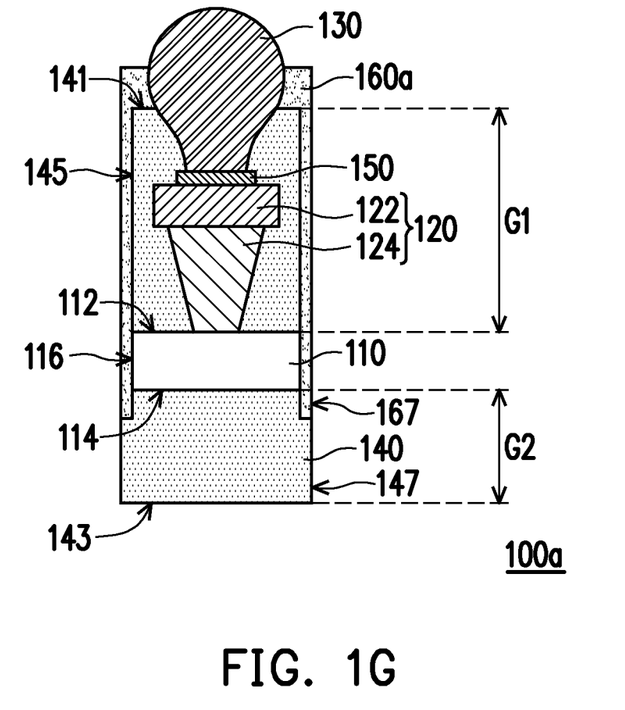
FIG. 1G is a schematic cross-sectional view of a chip packaging structure according to an embodiment of the disclosure.

Finally, referring to both FIG. 1E and FIG. 1F, a singulation process is performed to cut the stress buffer layer 164 and the encapsulant 142 to form a plurality of chip packaging structures separated from each other (four chip packaging structures 100a are shown schematically). Meanwhile, the cut stress buffer layer 160a covers a first side surface 145 and the upper surface 141 of the cut encapsulant 140, and an outer surface 167 of the cut stress buffer layer 160a is aligned with a second side surface 147 of the cut encapsulant 140. At the phase, the fabrication of the chip packaging structure 100a has been completed.

Regarding the structure, refer to FIG. 1G. The chip packaging structure 100a in the embodiment includes the chip 110, the redistribution layer 120, the solder ball 130, the encapsulant 140, and the stress buffer layer 160a. The chip 110 has the active surface 112 and the back surface 114 opposite to each other, and the peripheral surface 116 connected to the active surface 112 and the back surface 114. The redistribution layer 120 is disposed on the active surface 112 of the chip 110, and the redistribution layer 120 includes the circuit layer 122 and the conductive via 124. The conductive via 124 is located between the circuit layer 122 and the active surface 112 of the chip 110, and the chip 110 is electrically connected to the circuit layer 122 through the conductive via 124. The solder ball 130 is disposed on the redistribution layer 120, and the chip 110 is electrically connected to the solder ball 130 through the redistribution layer 120.

Moreover, the encapsulant 140 in the embodiment encapsulates the active surface 112 and the back surface 114 of the chip 110, the redistribution layer 120, and part of the solder ball 130. Furthermore, the encapsulant 140 has the upper surface 141 and the lower surface 143 opposite to each other. The side surface is connected to the upper surface 141 and the lower surface 143, and the side surface includes the first side surface 145 and the second side surface 147. A first vertical distance G1 exists between the upper surface 141 of the encapsulant 140 and the active surface 112 of the chip 110, a second vertical distance G2 exists between the lower surface 143 of the encapsulant 140 and the back surface 114 of the chip 110, and the first vertical distance G1 is greater than the second vertical distance G2.

In particular, the stress buffer layer 160a covers the peripheral surface 116 of the chip 110 and is extended to cover the first side surface 145 and the upper surface 141 of the encapsulant 140, and the outer surface 167 of the stress buffer layer 160a is aligned with the second side surface 147. Meanwhile, the material of the stress buffer layer 160a is different from the material of the encapsulant 140, and the material of the stress buffer layer 160a, for example, is silane adhesion promoters, silicone rubber, epoxy resin, or photosensitive dielectric materials (e.g., PI, PBO, BCB, or PID), but the disclosure is not limited thereto.

In addition, the chip packaging structure 100a in the embodiment further includes the surface treatment layer 150 disposed on the redistribution layer 120 and between the solder ball 130 and the redistribution layer 120. The surface treatment layer 150, for example, is an electroless nickel electroless palladium immersion gold (ENEPIG) layer or an organic solderability preservatives (OSP) layer, or an electroless nickel immersion gold (ENIG) layer, but the disclosure is not limited thereto.

In the embodiment, the encapsulant 140 encapsulates the active surface 112 and the back surface 114 of the chip 110, the redistribution layer 120, and part of the solder ball 130, so the stress buffer layer 160a at least covers the peripheral surface 116 of the chip 110 (the stress buffer layer 160a may protrude downward with a height or may be aligned with the chip 110). In other words, the active surface 112 and the back surface 114 of the chip 110 are protected by the encapsulant 140, and the peripheral surface 116 of the chip 110 is protected by the stress buffer layer 160a. That is, with the disposition of the stress buffer layer 160a, the edges of the chip 110 are effectively protected; and with the disposition of the encapsulant 140, the structural strength of the chip packaging structure 100a is increased, and therefore the chip packaging structure 100a in the embodiment has favorable structural reliability.

It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

Figure 2A:
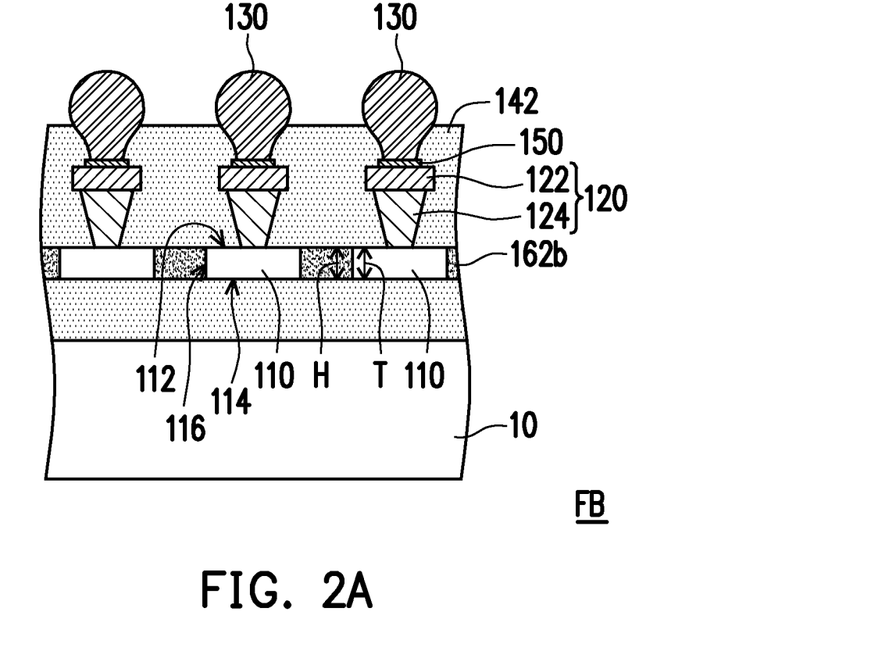
FIG. 2A to FIG. 2C are schematic cross-sectional views showing part of steps of a manufacturing method of a chip packaging structure according to another embodiment of the disclosure.
Figure 2B:
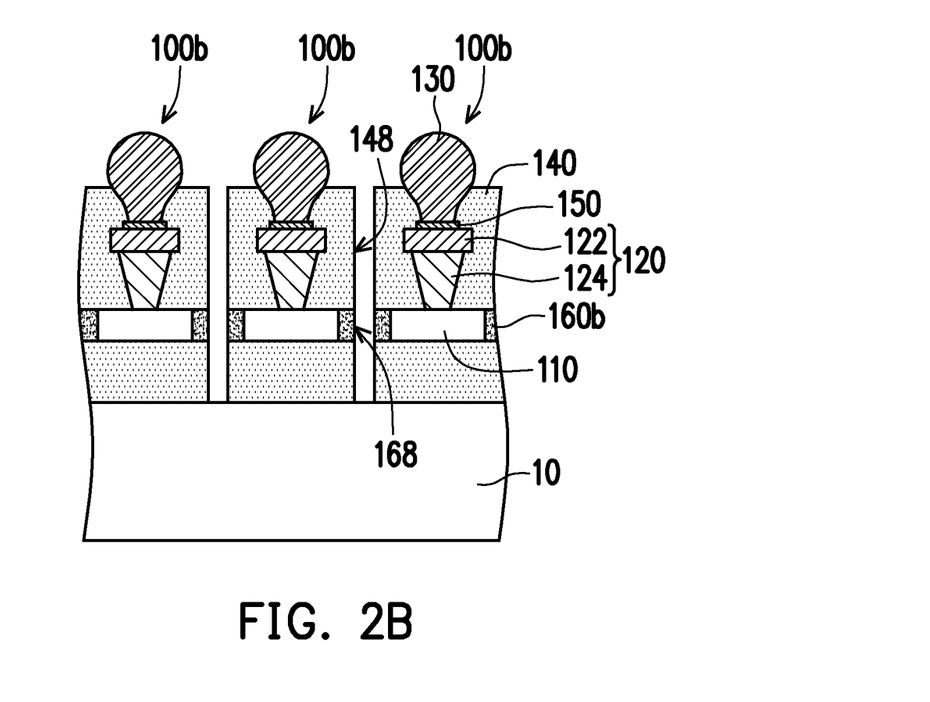
Figure 2C:
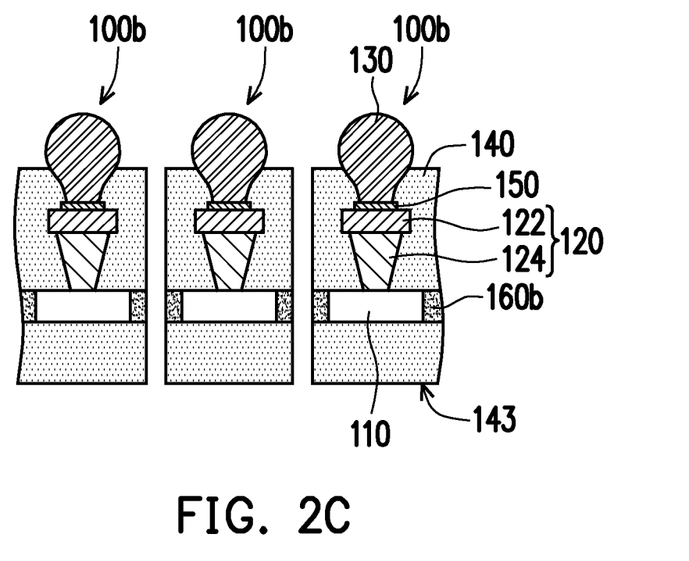
Figure 2D:
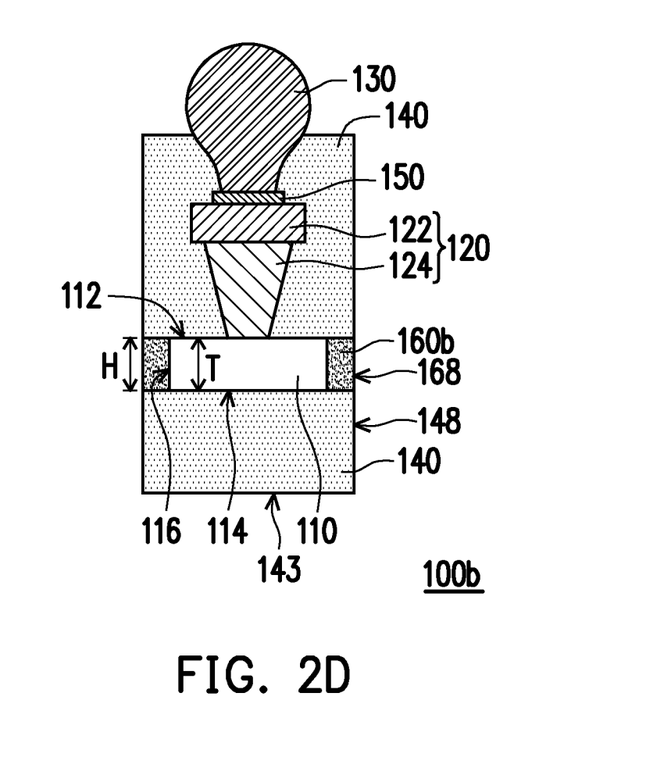
FIG. 2D is a schematic cross-sectional view of a chip packaging structure according to another embodiment of the disclosure.

FIG. 2A to FIG. 2C are schematic cross-sectional views showing part of steps of a manufacturing method of a chip packaging structure according to another embodiment of the disclosure. FIG. 2D is a schematic cross-sectional view of a chip packaging structure according to another embodiment of the disclosure.

The manufacturing method of a chip packaging structure 100b in the embodiment is similar to the manufacturing method of the chip packaging structure 100a. The difference between the two is as follows. Referring to FIG. 2A first, the carrier board 10 and a semi-finished package FB are provided, and the semi-finished package FB is disposed on the carrier board 10. In detail, the semi-finished package FB includes a plurality of the chips 110, the redistribution layer 120, a plurality of the solder balls 130, the encapsulant 142, and a stress buffer layer 162b. The plurality of the chips 110 are separated from one another, and each of the plurality of the chips 110 has the active surface 112 and the back surface 114 opposite to each other, and the peripheral surface 116 connected to the active surface 112 and the back surface 114. The redistribution layer 120 is disposed on the active surface 112 of the chip 110, and the redistribution layer 120 includes the circuit layer 122 and the conductive via 124. The conductive via 124 is located between the circuit layer 122 and the active surface 112 of the chip 110, and the chip 110 is electrically connected to the circuit layer 122 through the conductive via 124. Each of the plurality of the chips 110 is electrically connected to each corresponding solder ball 130 through the redistribution layer 120.

Furthermore, the encapsulant 142 in the embodiment encapsulates the active surface 112 and the back surface 114 of each of the plurality of the chips 110, the redistribution layer 120, part of the corresponding solder ball 130, and the stress buffer layer 162b. In particular, in the embodiment, the stress buffer layer 162b covers the peripheral surface 116 of each of the plurality of the chips 110, and a height H of the stress buffer layer 162b is equal to or slightly greater than a thickness T of each of the plurality of the chips 110. The material of the stress buffer layer 162b is different from the material of the encapsulant 142, and the material of the stress buffer layer 162b, for example, is silane adhesion promoters, silicone rubber, epoxy resin, or photosensitive dielectric materials (e.g., PI, PBO, BCB, or PID), but the disclosure is not limited thereto. In addition, the semi-finished package FB in the embodiment further includes the surface treatment layer 150 disposed on the redistribution layer 120 and between the solder ball 130 and the redistribution layer 120. The surface treatment layer 150, for example, is an electroless nickel electroless palladium immersion gold (ENEPIG), an organic solderability preservatives (OSP) layer, or an electroless nickel immersion gold (ENIG) layer, but the disclosure is not limited thereto.

In short, the semi-finished package FB in the embodiment is an implementation structure of a fan out wafer level chip scale package (a Fan out WLCSP), reassembling the chip 110 on the carrier board 10 and completing the wiring and ball planting procedures after adopting the stress buffer layer 162b to protect the peripheral surface 116 of the chip 110.

Next, referring to both FIG. 2A and FIG. 2B, the singulation process is performed to cut the stress buffer layer 162b and the encapsulant 142 to form the plurality of the chip packaging structures 100b separated from one another. Meanwhile, one side surface 148 of the cut encapsulant 140 is aligned with an outer surface 168 of the stress buffer layer 160b. Finally, referring to FIG. 2B and FIG. 2C, the carrier board 10 is removed, and the lower surface 143 of the encapsulant 140 is exposed to complete the fabrication of the chip packaging structure 100b.

Regarding the structure, refer to both FIG. 1G and FIG. 2D. The chip packaging structure 100b in the embodiment is similar to the chip packaging structure 100a, and the difference between the two is as follows. The stress buffer layer 160b in the embodiment only covers the peripheral surface 116 of the chip 110, and the height H of the stress buffer layer 160b is equal to or slightly greater than the thickness T of the chip 110. The material of the stress buffer layer 160b is different from the material of the encapsulant 140, and the material of the stress buffer layer 160b, for example, is silane adhesion promoters, silicone rubber, epoxy resin, or photosensitive dielectric materials (e.g., PI, PBO, BCB, or PID), but the disclosure is not limited thereto.

In the embodiment, the encapsulant 140 encapsulates the active surface 112 and the back surface 114 of the chip 110, so the stress buffer layer 160b covers the peripheral surface 116 of the chip 110. That is, the active surface 112 and the back surface 114 of the chip 110 are protected by the encapsulant 140, and the peripheral surface 116 of the chip 110 is protected by the stress buffer layer 160b. With the disposition of the stress buffer layer 160b, the edges of the chip 110 are effectively protected, and with the disposition of the encapsulant 140, the structural strength of the chip packaging structure 100b is increased, and therefore the chip packaging structure 100b in the embodiment has favorable structural reliability.

Based on the above, in the chip packaging structure in the disclosure, the active surface and the back surface of the chip are protected by the encapsulant, and the peripheral surface of the chip is protected by the stress buffer layer. Therefore, with the disposition of the stress buffer layer, the edges of the chip are effectively protected, and with the disposition of the encapsulant, the structural strength of the chip packaging structure is increased, and therefore the chip packaging structure in the disclosure has favorable structural reliability.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A chip packaging structure, comprising:
   a chip comprising an active surface and a back surface opposite to each other, and a peripheral surface connected to the active surface and the back surface;
   a redistribution layer disposed on the active surface of the chip;
   a solder ball disposed on the redistribution layer, wherein the chip is electrically connected to the solder ball through the redistribution layer;

an encapsulant encapsulating the active surface and the back surface of the chip, the redistribution layer, and part of the solder ball; and a stress buffer layer at least covering the peripheral surface of the chip, wherein an outer surface of the stress buffer layer is aligned with one side surface of the encapsulant wherein the encapsulant comprises an upper surface and a lower surface opposite to each other, the side surface is connected to the upper surface and the lower surface, the side surface comprises a first side surface and a second side surface, the stress buffer layer is further extended to cover the first side surface and the upper surface, and the outer surface of the stress buffer layer is aligned with the second side surface; and wherein a first vertical distance exists between the upper surface of the encapsulant and the active surface of the chip, a second vertical distance exists between the lower surface of the encapsulant and the back surface of the chip, and the first vertical distance is greater than the second vertical distance.

2. The chip packaging structure according to claim 1, wherein the redistribution layer comprises a circuit layer and at least one conductive via, the at least one conductive via is located between the circuit layer and the active surface of the chip, and the chip is electrically connected to the circuit layer through the at least one conductive via.

3. The chip packaging structure according to claim 1, further comprising:

a surface treatment layer disposed on the redistribution layer and located between the solder ball and the redistribution layer.

4. The chip packaging structure according to claim 1, wherein a material of the stress buffer layer is different from a material of the encapsulant, and the material of the stress buffer layer comprises silane adhesion promoters, silicone rubber, epoxy resin, or photosensitive dielectric materials.

* * * * *